(12) United States Patent
Igari et al.

(10) Patent No.: US 9,940,192 B2
(45) Date of Patent: Apr. 10, 2018

(54) NON-VOLATILE SEMICONDUCTOR STORAGE APPARATUS

(71) Applicant: Toshiba Memory Corporation, Minato-ku (JP)

(72) Inventors: Fubito Igari, Yokohama (JP); Hiroyuki Suto, Kamakura (JP); Yasuyuki Ozawa, Tama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/528,825

(22) Filed: Oct. 30, 2014

(65) Prior Publication Data

US 2015/0052414 A1 Feb. 19, 2015

Related U.S. Application Data

(62) Division of application No. 13/753,128, filed on Jan. 29, 2013, now Pat. No. 8,918,699.

(60) Provisional application No. 61/677,648, filed on Jul. 31, 2012.

(51) Int. Cl.

| | |
|---|---|
| *G11C 29/00* | (2006.01) |
| *G06F 11/10* | (2006.01) |
| *G11C 7/04* | (2006.01) |
| *G06F 3/06* | (2006.01) |
| *G11C 29/04* | (2006.01) |

(52) U.S. Cl.
CPC ........ *G06F 11/1008* (2013.01); *G06F 3/0619* (2013.01); *G06F 3/0653* (2013.01); *G06F 3/0679* (2013.01); *G06F 11/1048* (2013.01); *G11C 7/04* (2013.01); *G11C 2029/0411* (2013.01)

(58) Field of Classification Search
None
See application file for complete search history.

(56) References Cited

U.S. PATENT DOCUMENTS 5,892,408 A * 4/1999 Binder .................... H03L 1/026
                                                         331/176
7,663,905 B2 * 2/2010 Shuto ....................... G11C 7/04
                                                        365/145

(Continued)

FOREIGN PATENT DOCUMENTS

| JP | 63-21934 | 5/1988 |
|---|---|---|
| JP | 06-119256 | 4/1994 |

(Continued)

*Primary Examiner* — M. Mujtaba Chaudry
(74) *Attorney, Agent, or Firm* — Oblon, McClelland, Maier & Neustadt, L.L.P.

(57) ABSTRACT

According to one embodiment, a non-volatile semiconductor storage apparatus is configured to decide determination periods respectively corresponding to each of management blocks based on rewrite count information items and a temperature, and to perform a determination processing for each of management blocks for each determination period. The determination processing includes determining whether first data read from a block in the blocks is normal based on the number of errors that are occurred in the first data. The apparatus is configured to perform a rewrite processing of rewriting the first data to second data which is error-corrected when it is determined that the first data is not normal.

8 Claims, 12 Drawing Sheets

(56) References Cited

U.S. PATENT DOCUMENTS

| | | | |
|---|---|---|---|
| 8,111,559 B2* | 2/2012 | Kwon | G11C 7/04 |
| | | | 365/148 |
| 8,161,346 B2 | 4/2012 | Hirose et al. | |
| 2003/0200384 A1* | 10/2003 | Edanami | G06F 3/0601 |
| | | | 711/112 |
| 2007/0211512 A1* | 9/2007 | Shuto | G11C 7/04 |
| | | | 365/145 |
| 2008/0094930 A1* | 4/2008 | Mokhlesi | G11C 7/04 |
| | | | 365/211 |
| 2008/0247241 A1* | 10/2008 | Nguyen | G11C 11/5621 |
| | | | 365/185.22 |
| 2008/0247254 A1* | 10/2008 | Nguyen | G11C 11/5628 |
| | | | 365/212 |
| 2009/0222615 A1* | 9/2009 | Kurashige | G06F 3/0617 |
| | | | 711/103 |
| 2010/0106901 A1 | 4/2010 | Higeta et al. | |
| 2010/0199149 A1* | 8/2010 | Weingarten | G06F 11/1068 |
| | | | 714/773 |
| 2010/0259998 A1* | 10/2010 | Kwon | G11C 7/04 |
| | | | 365/189.05 |
| 2011/0219203 A1* | 9/2011 | Nurminen | G11C 7/04 |
| | | | 711/165 |
| 2011/0280084 A1 | 11/2011 | Radke et al. | |
| 2012/0268994 A1* | 10/2012 | Nagashima | G06F 11/1048 |
| | | | 365/185.11 |
| 2013/0067136 A1* | 3/2013 | Bates | G06F 12/00 |
| | | | 711/103 |

FOREIGN PATENT DOCUMENTS

| | | |
|---|---|---|
| JP | 09-160837 | 6/1997 |
| JP | 2000-011670 | 1/2000 |
| JP | 2008-299621 | 12/2008 |
| JP | 2008-310888 | 12/2008 |
| JP | 2010-160816 | 7/2010 |
| WO | WO 2009/011052 A1 | 1/2009 |

* cited by examiner

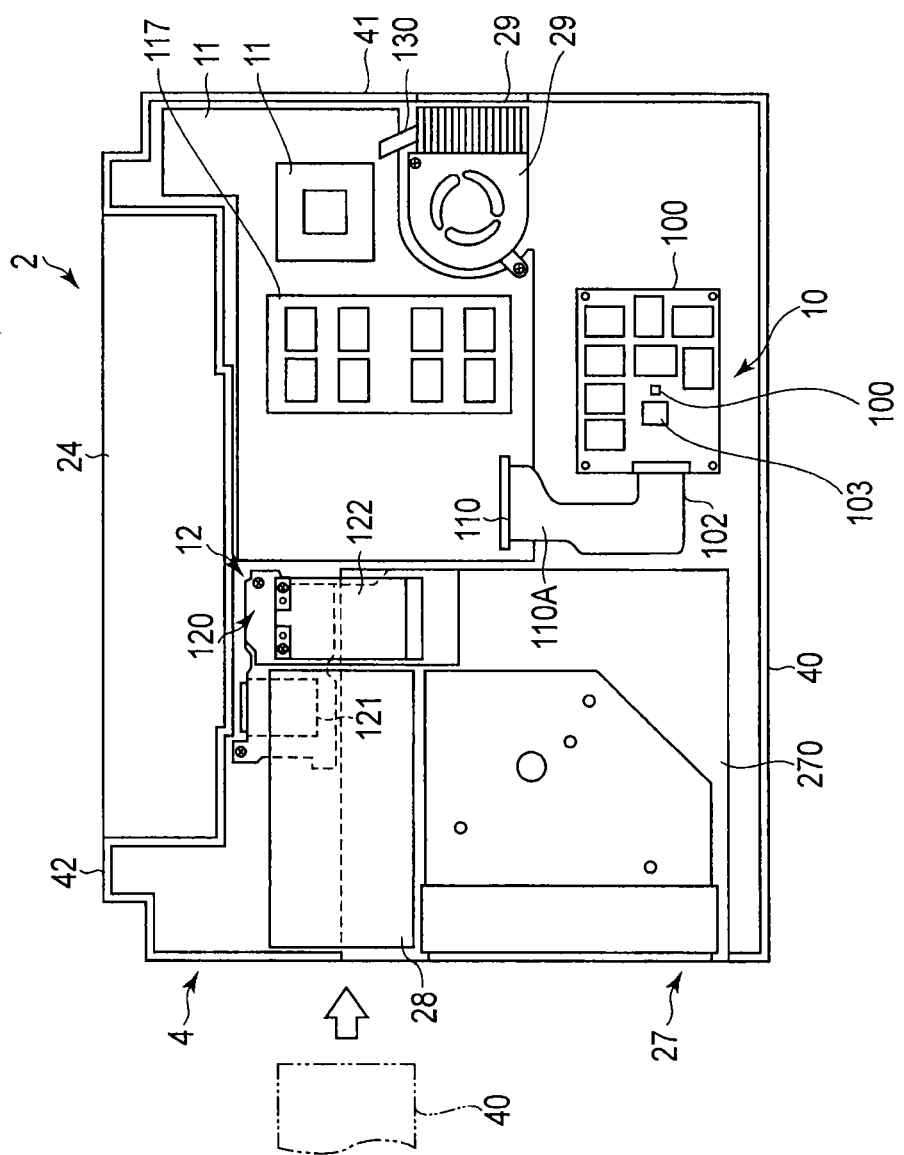
F I G. 2

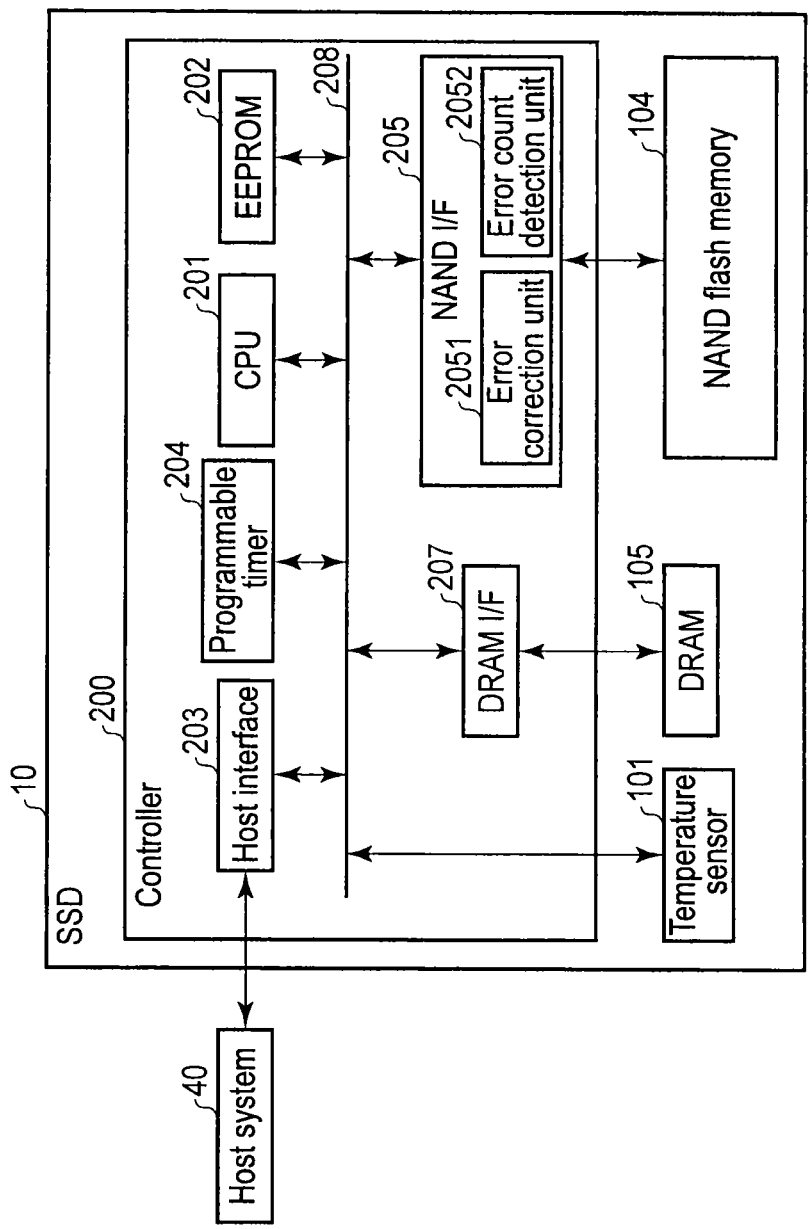
F I G. 4

| | $0 < N_R \le A$ | $A < N_R \le B$ | $B < N_R \le C$ | $C < N_R \le D$ | $D < N_R \le E$ | $E < N_R \le F$ |
|---|---|---|---|---|---|---|
| 70°C < T | 1 | 1 | 1 | 1 | 1 | 1 |
| 60°C < T ≤ 70°C | 1 | 1 | 1 | 1 | 1 | 1 |
| 50°C < T ≤ 60°C | 2 | 1 | 1 | 1 | 1 | 1 |
| 40°C < T ≤ 50°C | 5 | 3 | 2 | 1 | 1 | 1 |
| 30°C < T ≤ 40°C | 15 | 9 | 6 | 2 | 1 | 1 |
| 20°C < T ≤ 30°C | 50 | 30 | 20 | 3 | 1 | 1 |
| 10°C < T ≤ 20°C | 180 | 115 | 75 | 10 | 2 | 2 |
| 0°C < T ≤ 10°C | 700 | 450 | 300 | 37 | 6 | 3 |
| T ≤ 0°C | 3200 | 2100 | 1300 | 165 | 23 | 10 |
| | | | | | 103 | 43 |

F I G. 6

| | $0 \leq N_R < A$ | $A \leq N_R < B$ | $B \leq N_R < C$ | $C \leq N_R < D$ | $D \leq N_R < E$ | $E \leq N_R < F$ |
|---|---|---|---|---|---|---|
| 70°C ≤ T | 4 | 3 | | | | |
| 60°C ≤ T < 70°C | 4 | 3 | 1 | 1 | 1 | 1 |
| 50°C ≤ T < 60°C | 6 | 8 | 5 | 1 | 1 | 3 |
| 40°C ≤ T < 50°C | 7 | 8 | 7 | 2 | 3 | 4 |
| 30°C ≤ T < 40°C | 8 | 8 | 7 | 6 | 7 | 4 |
| 20°C ≤ T < 30°C | 8 | 8 | 8 | 9 | 12 | 7 |
| 10°C ≤ T < 20°C | 8 | 8 | 8 | 13 | 12 | 12 |
| 0°C ≤ T < 10°C | 8 | 8 | 8 | 14 | 15 | 14 |
| T < 0°C | 8 | 8 | 8 | 15 | 15 | 15 |

FIG. 7

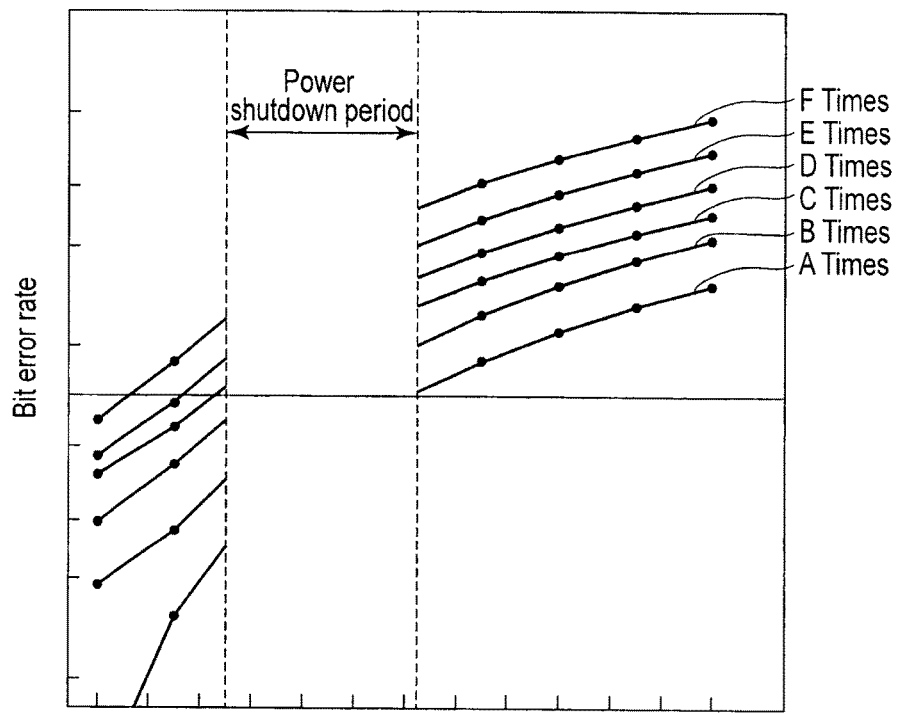
F I G. 11
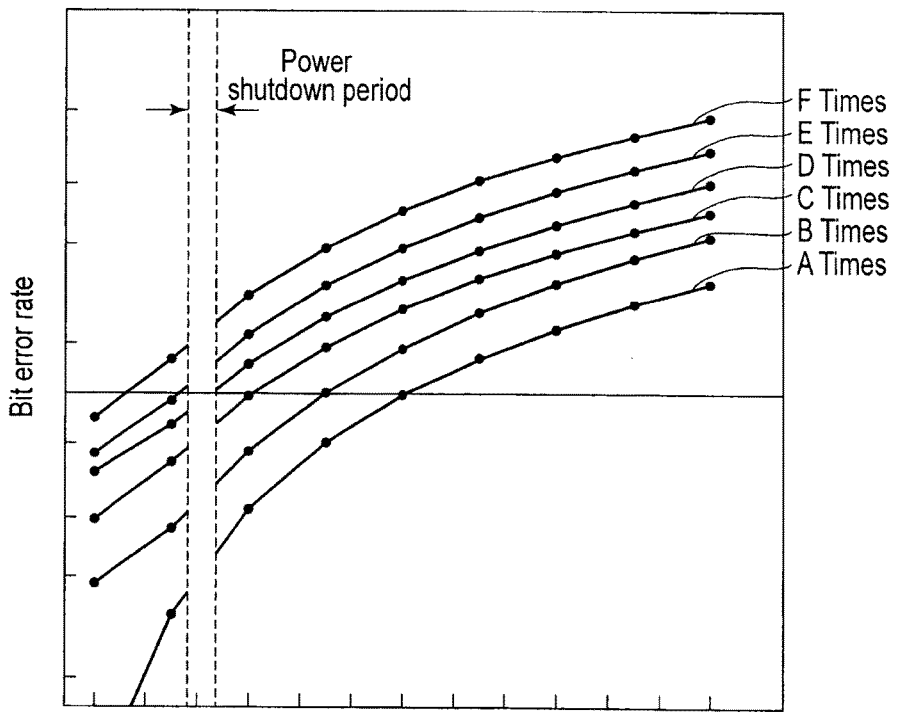
F I G. 12

NON-VOLATILE SEMICONDUCTOR STORAGE APPARATUS

CROSS-REFERENCE TO RELATED APPLICATIONS

This application is a division of and claims the benefit of priority under 35 U.S.C. § 120 from U.S. Ser. No. 13/753,128 filed Jan. 29, 2013, and claims the benefit of U.S. Provisional Application No. 61/677,648 filed Jul. 31, 2012, the entire contents of each of which are incorporated herein by reference.

FIELD

Embodiments described herein relate generally to a non-volatile semiconductor storage apparatus including a non-volatile memory.

BACKGROUND

A NAND flash memory is a non-volatile memory capable of holding information even after the stop of power supply. It is superior to other non-volatile memories in terms of bit unit cost and has therefore become widespread. In the NAND flash memory, however, memory cells for storing data wear. The wear causes degradation of saved data, and the stored data cannot correctly be reproduced at high possibility. The time to retain stored data shortens in accordance with the degree of exhaustion.

Using error correction codes (ECCs) for correcting data errors that have occurred enables to reconstruct correct data. However, since the data on the NAND flash memory remains erroneous, the correct data cannot be reconstructed if errors beyond the correction capabilities of the ECCs have occurred.

BRIEF DESCRIPTION OF THE DRAWINGS

FIG. 2 is an exemplary bottom view showing the interior of the main body of the information processing apparatus shown in FIG. 1.

FIG. 4 is an exemplary block diagram showing the arrangement of the non-volatile semiconductor storage apparatus according to the first embodiment.

FIG. 6 is an exemplary table showing a patrol execution period factor for each combination of the temperature and rewrite count.

FIG. 7 is an exemplary table showing a patrol count to perform rewrite, which corresponds to each combination of the temperature and rewrite count.

FIG. 11 is an exemplary graph showing the characteristic of the bit error rate to time when the rewrite counts are A, B, C, D, E, and F.

FIG. 12 is an exemplary graph showing the characteristic of the bit error rate to time when the rewrite counts are A, B, C, D, E, and F.

DETAILED DESCRIPTION

In general, according to one embodiment, a non-volatile semiconductor storage apparatus includes a non-volatile semiconductor memory, a management module, a sensor, a decision module, an error correction module, an error detection module, a first determination module, and a rewrite module. The non-volatile semiconductor memory comprises erase unit blocks in which data is erased for each erase unit block. The management module is configured to manage rewrite count information items representing rewrite counts of management blocks. Each management block comprises at least one erase unit block. The sensor is configured to measure a temperature. The decision module is configured to decide determination periods respectively corresponding to each management block based on the rewrite count information items and the measured temperature. The error correction module is configured to perform error correction of data stored in the non-volatile semiconductor memory. The error detection module is configured to detect the number of errors that are occurred in the data which is not performed error correction. The first determination module is configured to perform a determination processing for each management block for each determination period. The determination processing for a first management block included in the management blocks comprises reading out first data from the first management block and determining, whether the first data is normal, based on the number of errors detected by the error detection module. The rewrite module is configured to perform a rewrite processing of rewriting the first data to second data which is error-corrected by the error detection module when it is determined that the first data is not normal.

Various embodiments will be described hereinafter with reference to the accompanying drawings.

First Embodiment

A non-volatile semiconductor storage apparatus can be implemented as a solid-state drive (SSD). The non-volatile semiconductor storage apparatus includes a non-volatile semiconductor memory (non-transitory medium).

(Arrangement of Information Processing Apparatus)

Figure 1:
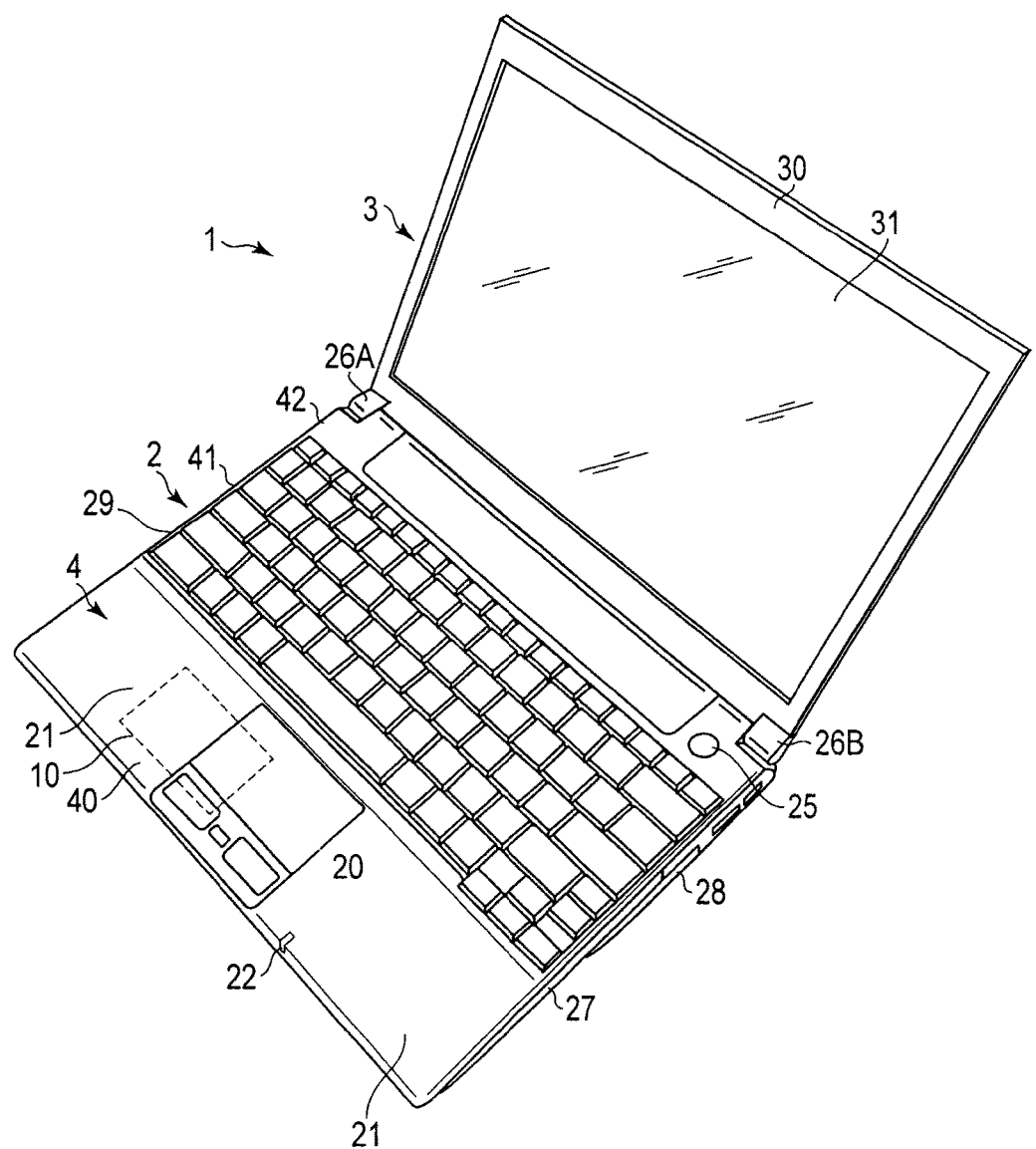
FIG. 1 is an exemplary perspective view showing the outer appearance of an information processing apparatus according to the first embodiment.

FIG. 1 is a schematic view showing the outer appearance of an information processing apparatus according to the first embodiment. An information processing apparatus 1 includes a main body 2 and a display unit 3 attached to the main body 2.

The main body 2 includes a box-shaped casing 4. The casing 4 includes a front portion 40, a central portion 41, and a back portion 42 sequentially from the side close to the user who operates the information processing apparatus 1.

The front portion 40 comprises a touchpad 20, a palm rest 21, and an LED 22. The touchpad 20 is a pointing device.

The LED 22 lights up in synchronism with the operation of each portion of the information processing apparatus 1.

The central portion 41 comprises a keyboard mounting portion 23. A keyboard 23A capable of inputting character information is attached to the keyboard mounting portion 23.

The back portion 42 comprises a battery pack 24, a power switch 25, and a pair of hinge portions 26A and 26B. The battery pack 24 is detachable. The power switch 25 is provided on the right side of the battery pack 24. The power switch 25 is provided to power on the information processing apparatus 1. The pair of hinge portions 26A and 26B are provided on the left and right sides of the battery pack 24. The pair of hinge portions 26A and 26B rotatably support the display unit 3.

The casing 4 is provided with an outlet 29 that sends air outward from inside of the casing 4. An optical disk drive (ODD) 27 capable of writing/reading data to/from an optical storage medium such as a DVD and a card slot 28 that receives or ejects various kinds of cards 280 are arranged in the casing 4.

A solid-state drive (SSD) 10 serving a non-volatile semiconductor storage apparatus is accommodated in the casing 4. Note that details of the SSD 10 will be described later.

The display unit 3 comprises a display housing 30 and a display screen 31. The display screen 31 is formed from an LCD or the like. The display screen 31 is accommodated in the display housing 30.

FIG. 2 is a bottom view of the main body 2 viewed from the lower side. The casing 4 accommodates a main circuit board 11, an expansion module 12, a fan 13, and the like, in addition to the SSD 10, the battery pack 24, the ODD 27, and the card slot 28 described above.

The main circuit board 11 is a unit that includes a plurality of electronic components and performs a predetermined operation when the electronic components function. The main circuit board 11 is connected to the SSD 10 via a cable 110a coupled with a connector 110. The main circuit board 11 is also connected to the battery pack 24, the ODD 27, the card slot 28, the expansion module 12, the fan 13, and the like via cables (not shown).

The ODD 27 includes a case 270 and a disk tray 271. The case 270 is accommodated in the casing 4. The disk tray 271 is extractably accommodated in the case 270 and holds an optical storage medium on it.

The shape of the card slot 28 is defined by the standard of, for example, a PC card slot or ExpressCare® slot.

The expansion module 12 comprises an expansion circuit board 120, a card socket 121 provided on the expansion circuit board 120, and an expansion module board 122 inserted in the card socket 121. The card socket 121 is based on the standard of, for example, Mini-PCI. Examples of the expansion module board 122 are a Third Generation (3G) module, a TV tuner, a Global Positioning System (GPS) module, and a Worldwide Interoperability for Microwave Access (WiMAX) module.

The fan 13 is a cooling module that cools the interior of the casing 4 by blast of air. The fan 13 externally sends air in the casing 4 via the outlet 29 as an air stream. One end of a heat pipe 130 is provided between the fan 13 and the outlet 29. The other end (not shown) of the heat pipe 130 is provided to be in contact with a CPU 115. A working fluid sealed in the heat pipe 130 generates a vapor on the side of the CPU 115 that is a heated portion. The vapor moves, through the pipe, to the side of the outlet that is a cold portion. The vapor dissipates latent heat of vaporization when condensing on the outlet side. The condensed working fluid is refluxed to the heated portion.

The SSD 10 comprises a board 100. A temperature sensor 101, a connector 102, and a controller 103 are mounted on the board 100.

(Arrangement of SSD)

Figure 3:
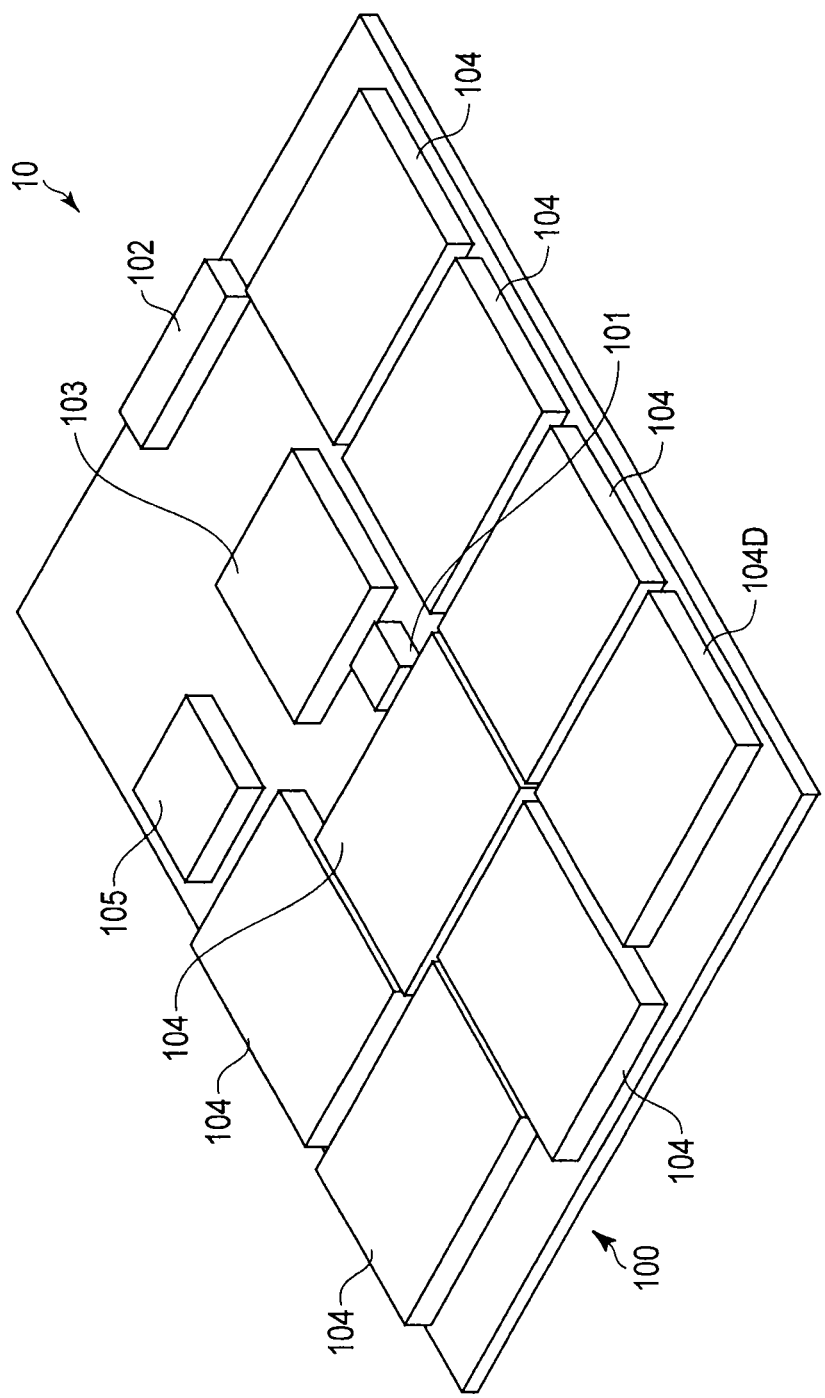
FIG. 3 is an exemplary perspective view showing the outer appearance of a non-volatile semiconductor storage apparatus according to the first embodiment.

FIG. 3 is a perspective view showing an example of the outer appearance of the SSD 10. The SSD 10 comprises the board 100. The temperature sensor 101, the connector 102, the controller 103, eight NAND flash memories 104, and dynamic random access memory (DRAM) 105 are mounted on the board 100. The SSD 10 can readably/rewritably store programs such as an operating system (OS) and data created by the user or based on execution of software in the storage areas of the eight NAND flash memories 104 mounted on the board 100 for a long time, like a conventional hard disk drive.

The temperature sensor 101 is located between a long side of a NAND flash memory 104 and one side of the controller 103 and provided to be adjacent to these sides. The connector 102 configured to connect the SSD 10 to an external device is provided on a side of the controller 103 opposite to the side where the temperature sensor 101 is provided.

FIG. 4 is a block diagram showing the arrangement of the SSD 10.

The SSD 10 includes the temperature sensor 101, the DRAM 105, a controller 200, and the NAND flash memory 104. The controller 200 comprises a central processing unit (CPU) 201, an electrically erasable programmable read-only memory (EEPROM) 202, a host interface 203, a programmable timer 204, a NAND interface 205, a DRAM interface 207, and a bus 208. The NAND flash memory 104 is formed by arraying a plurality of erase unit blocks that are units of data erase. Each erase unit block includes a plurality of memory cells.

The CPU 201 executes firmware stored in the EEPROM 202. The EEPROM 202 stores firmware, data, and the like. The host interface 203 communicates with a host system 40 connected to the SSD 10. The NAND interface 205 controls data transfer to/from the NAND flash memory 104. The DRAM interface 207 controls data transfer to/from the DRAM 105. The bus 208 communicably connects the constituent units of the SSD 10.

The SSD 10 communicates with the host system 40 via the host interface 203. Data transfer between the SSD 10 and the host system 40 is performed based on a request from the host system 40. Interpretation of the request from the host system 40 and control of the SSD 10 itself are implemented by causing the CPU 201 to interpret the firmware stored in the EEPROM 202 inside the controller 200. Data supplied from the host system 40 is stored in the NAND flash memory 104. The controller 200 mediates data transfer between the host system 40 and the NAND flash memory 104.

The DRAM 105 is a buffer memory that temporarily stores data when data read/write is performed for the NAND flash memory 104.

When an error correction module 2051 performs error correction at the time of data read from the NAND flash memory 104, the NAND interface 205 interrupts the CPU 201 and notifies that an error has occurred in the data stored in the NAND flash memory 104. The CPU 201 accesses an error count detection module 2052 in the NAND interface 205 and acquires the number of errors that have occurred.

When an arbitrary time is set, the programmable timer 204 internally measures the time and generates an interrupt to the CPU 201 after the elapse of the set time. By the interrupt from the programmable timer 204, the CPU 201 can know that the set time has elapsed. A plurality of times corresponding to the management blocks can be set in the programmable timer 204. The programmable timer 204 generates an interrupt to the CPU 201 after the elapse of the set time.

A plurality of times can be set in the programmable timer 204. An ID is assigned to each set time. When the set time has elapsed, the programmable timer 204 generates an interrupt including the assigned ID.

The programmable timer 204 has an operating time count function of counting the time the SSD 10 is operating.

At the time of data write, the NAND flash memory 104 stores data supplied from the host system 40 and an error correction code (ECC) calculated from the data by the error correction module 2051 together.

Figure 5:
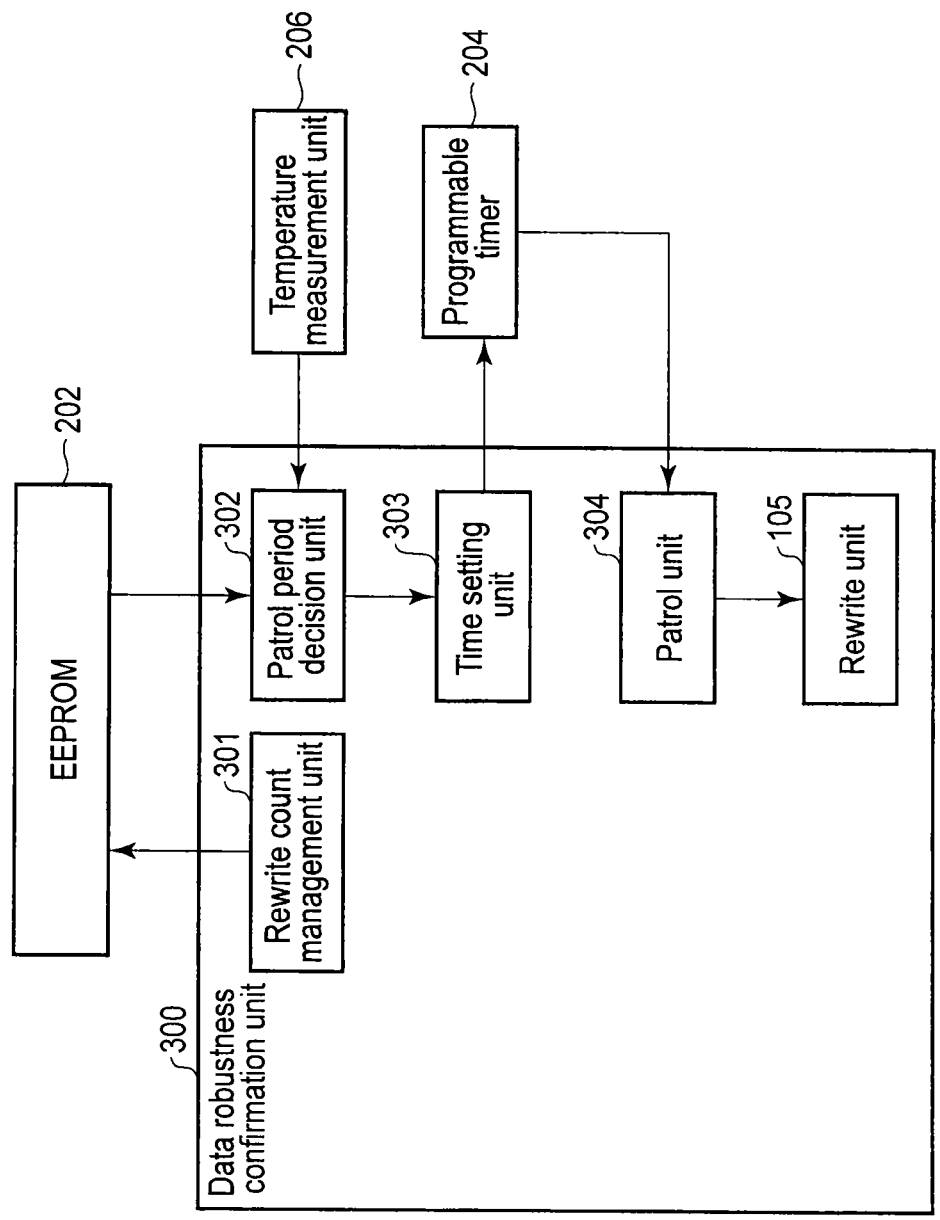
FIG. 5 is an exemplary block diagram showing the arrangement of a data robustness confirmation module according to the first embodiment.

A plurality of management blocks are set for the NAND flash memory. Each management block includes one or more erase unit blocks. To confirm the robustness of data stored in each management block, the SSD 10 performs patrol processing of determining, in accordance with a period set for each management block, whether the data stored in the management block is normal. This patrol processing is done by firmware. FIG. 5 is a block diagram showing the arrangement of a data robustness confirmation module 300 that performs the patrol processing.

The data robustness confirmation module 300 comprises a rewrite count management module 301, a period decision module 302, a time setting module 303, a patrol module 304, and a rewrite module 305.

The rewrite count management module 301 manages a plurality of rewrite count information items representing the rewrite counts of a plurality of management blocks. The rewrite count information items are stored in, for example, the EEPROM 202.

The period decision module 302 decides the period to execute patrol of each management block based on the rewrite count information and the temperature measured by the temperature sensor 101. The period decision module 302 searches a patrol execution period factor table to be described later for an execution period factor corresponding to the rewrite count information and the temperature. The period decision module 302 decides the patrol execution period by multiplying the found execution period factor by a reference period.

The period decision module 302 also decides the period to execute rewrite based on the count information and the temperature measured by the temperature sensor 101. The period decision module 302 searches a rewrite execution period table (described later) representing a patrol count to perform rewrite for a period corresponding to the rewrite count information and the temperature. The period decision module 302 notifies the patrol unit of the found period.

The time setting module 303 sets a time in the programmable timer 204 based on the patrol execution period of each management block decided by the period decision module 302. The time setting module 303 sets, in the programmable timer 204, a combination of a set time and an ID assigned to the set time. Management block information representing a corresponding management block is associated with the ID. When the set time has elapsed, the programmable timer 204 generates an interrupt including the ID corresponding to the set time.

Upon receiving, from the programmable timer 204, an interrupt including an ID including information representing a management block, the patrol module 304 reads out data in the management block corresponding to the management block information associated with the ID. When the error count detection module 2052 has interrupted the CPU 201, the patrol module 304 acquires, from the error count detection module 2052, the number of errors that have occurred. The patrol module 304 calculates a bit error rate based on the acquired error count. The bit error rate is obtained by dividing the error count by the number of bits in the management block. The patrol module 304 determines whether the bit error rate is higher than the target bit error rate. If the bit error rate is not higher than the target bit error rate, the patrol module 304 determines that the data in the management block is normal. If the bit error rate is higher than the target bit error rate, the patrol module 304 determines that the data in the management block is not normal. Upon determining that the data is not normal, the patrol module 304 requests the rewrite module 305 to rewrite the data in the management block. In response to the request, the rewrite module 305 performs rewrite processing of writing data error-corrected by the error correction module 2051 in the management block.

The patrol module 304 requests the rewrite module 305 to rewrite the data in the management block when the patrol has been executed the number of times represented by a rewrite period table to be described later. The rewrite module 305 rewrites the data in the management block in response to the request.

FIG. 6 is a patrol execution period factor table showing a patrol execution period factor for each combination of the temperature and rewrite count. FIG. 7 is a rewrite execution period table showing the patrol count to perform rewrite processing, which corresponds to each combination of the temperature and rewrite count. The rewrite count changes between the individual management blocks. For this reason, a reference period is provided independently. Patrol of each management block is executed at an interval obtained by multiplying the patrol execution period factor by the reference period.

A rewrite count $N_R$ is divided into seven steps $0 < N_R \leq A$, $A < N_R \leq B$, $B < N_R \leq C$, $C < N_R \leq D$, $D < N_R \leq E$, and $E < N_R \leq F$. A temperature T is divided into nine steps $T \leq 0°$ C., $0°$ C.$< T \leq 10°$ C., $10°$ C.$< T \leq 20°$ C., $20°$ C.$< T \leq 30°$ C., $30°$ C.$< T \leq 40°$ C., $40°$ C.$< T \leq 50°$ C., $50°$ C.$< T \leq 60°$ C., $60°$ C.$< T \leq 70°$ C., and $70°$ C.$< T$.

For example, assume that the reference period is 10 hrs. Consider a case in which the temperature T is 40° C., and the rewrite count $N_R$ falls between A and B. In this case, patrol is executed once every 90 hrs (=10 hrs×9) based on the table shown in FIG. 6. In addition, rewrite processing is performed when patrol has been executed eight times based on the table shown in FIG. 7. Hence, the rewrite period is 720 hrs (=90 hrs×8).

Consider a case in which the temperature T is 70° C., and the rewrite count $N_R$ falls between E and F.

Patrol period: 10 hrs×1=10 hrs

Rewrite period: 10 hrs×1=10 hrs

Hence, the rewrite processing is executed every time the patrol is performed once.

Figure 8:
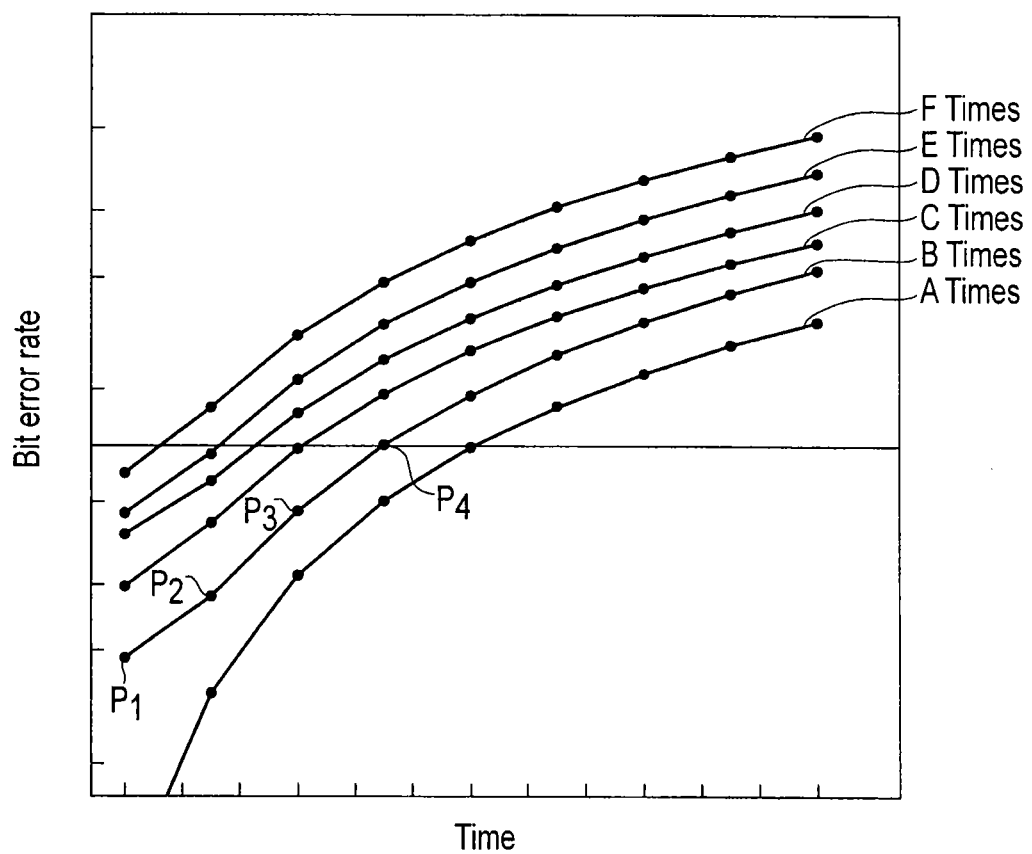
FIG. 8 is an exemplary graph showing the characteristic of the bit error rate to time when the rewrite counts are A, B, C, D, E, and F.

FIG. 8 is a graph showing the characteristic of the bit error rate to time when the rewrite counts are A, B, C, D, E, and F. The tables shown in FIGS. 6 and 7 can be derived from the temporal bit error rate characteristic for the rewrite count shown in FIG. 8. The intersections between the target bit error rate and the curves of the rewrite counts indicate times corresponding to the table shown in FIG. 7.

The patrol interval is decided considering how many times the patrol is to be executed within a time of the table shown in FIG. 6, and whether the time can be a multiple of the reference period.

Figure 9:
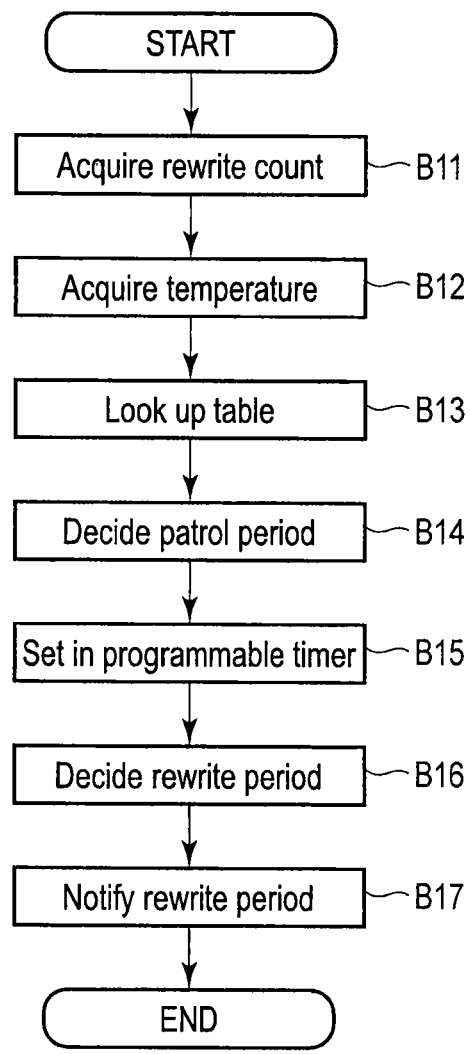
FIG. 9 is an exemplary flowchart showing a procedure of deciding the patrol period and the rewrite period.

FIG. 9 is a flowchart showing a procedure of deciding the patrol period and the rewrite period.

The period decision module 302 acquires the rewrite count information of a management block from the EEPROM 202 (block B11). The period decision module 302 acquires the temperature from the temperature sensor 101 (block B12). The period decision module 302 searches the patrol execution period factor table for an execution period factor corresponding to the rewrite count information and the temperature (block B13). The period decision module 302 multiplies the found execution period factor by the reference period, thereby deciding the patrol execution period (block B14). The period decision module 302 notifies the time setting module 303 of the patrol execution period. The time setting module 303 sets the patrol execution period in the programmable timer 204 (block B15).

To decide the rewrite period, the period decision module 302 searches the rewrite execution period table for a period corresponding to the rewrite count information and the temperature (block B16). The period decision module 302 notifies the patrol module 304 of the found period (block B17).

Figure 10:
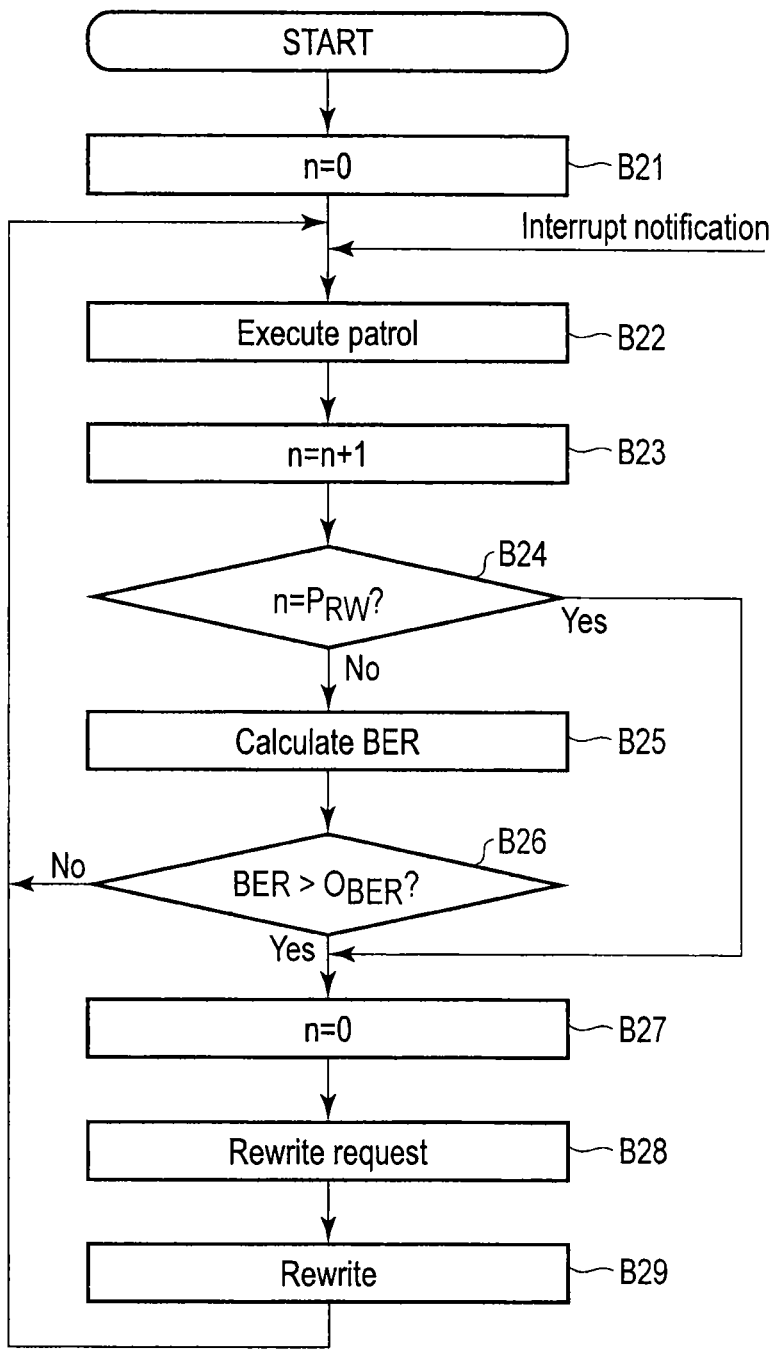
FIG. 10 is an exemplary flowchart showing a procedure of executing patrol and rewrite processing.

FIG. 10 is a flowchart showing a procedure of executing patrol and rewrite processing.

The patrol module 304 sets a value n representing the patrol count to 0 (block B21). Upon receiving an interrupt notification from the programmable timer 204, the patrol module 304 executes patrol of the management block corresponding to the interrupt notification (block B22). The patrol module 304 sets the value n to n+1 (block B23). The patrol module 304 determines whether the value n equals a patrol execution period $P_{RW}$ (block B24). Upon determining that they are not equal (NO in block B24), the patrol module 304 accesses the error count detection module 2052 and acquires the number of errors that have occurred. The patrol module 304 then calculates the bit error rate (BER) based on the error count and the number of bits in the management block (block B25). The patrol module 304 determines whether the bit error rate is higher than the target bit error rate (block B26).

Upon determining in block B24 that they equal (YES in block B24), or upon determining in block B26 that the bit error rate is higher (YES in block B26), the patrol module 304 sets the value n to 0 (block B27). The patrol module 304 requests the rewrite module 305 to perform rewrite processing (block B28). The rewrite module 305 performs rewrite processing in response to the request.

A patrol execution period factor corresponding to each management block is decided based on the temperature and the rewrite count, and patrol is performed for each management block in accordance with the corresponding to patrol execution period factor. This allows data in each block to be corrected before errors beyond the correction capabilities of ECCs occur.

A patrol execution period factor corresponding to each management block is decided based on the temperature and the rewrite count. However, a patrol execution period factor corresponding to each management block may be decided based on one of the temperature and the rewrite count.

(Long Power Shutdown Period)

The characteristic shown in FIG. 11 is the same as that shown in FIG. 8. However, the blank portion in FIG. 11 represents a power shutdown period.

In addition, for the characteristic shown in FIG. 11, it is assumed that the memory element temperature during power shutdown is not different from that during energization.

The case in which the rewrite count is F will be excluded from the description for the sake of simplicity of the description of the arrangement.

That is, management blocks where the rewrite counts are A to E coexist in the SSD 10.

If the SSD 10 has no means for knowing the power shutdown period, rewrite processing is preferably executed immediately after activation. This is because if the non-energization time is too long, the bit error rate exceeds the target bit error rate in all management blocks.

Hence, the rewrite module 305 may perform rewrite processing for all management blocks after power-on.

Performing rewrite processing for all management blocks after power-on enables to correct data in each management block before the bit error rate exceeds the target bit error rate in all management blocks.

(Short Power Shutdown Period)

The characteristic shown in FIG. 12 is assumed to be the same as that shown in FIG. 11 except that the power shutdown period is shorter.

The bit error rate has a margin to the target bit error rate in the management blocks where the rewrite counts are A, B, and C. In the management blocks where the rewrite counts are D and E, the patrol module 304 preferably executes rewrite processing immediately after power-on.

As described above, when patrol is performed for all management blocks, rewrite processing is performed even for the management blocks where the rewrite counts are A, B, and C, and the rewrite processing need not be performed.

When the SSD 10 acquires date/time information from the host system 40, management blocks that should undergo the rewrite processing at the time of power-on can be selected.

Since a programmable timer configured to measure time exists even in the SSD 10, the host system and the SSD 10 synchronize time information at least once a day. If an accuracy is a matter of special concern, the time synchronization operation may be executed a plurality of times during energization to the SSD 10, and a time error may be corrected. The simplest method is to cause the host system 40 to give the time information to the SSD 10.

At the time of activation, the host system 40 gives activation date/time information representing the activation date/time of the system to the SSD 10. The programmable timer 204 stores the activation date/time information and a current first operating time in the EEPROM 202. At the time of power shutdown, the difference between a current second operating time and the first operating time is added to the activation date/time information, thereby calculating the power shutdown date/time. The programmable timer 204 stores power shutdown date/time information representing the power shutdown date/time in, for example, the EEPROM 202. At the next time of activation, the host system 40 gives activation date/time information representing the activation date/time of the system to the SSD 10. The time setting module 303 calculates the difference between the power shutdown date/time and the activation date/time based on the power shutdown date/time information stored in the EEPROM 202 and the activation date/time information given by the host system 40, thereby obtaining the non-energization time.

Based on the calculated non-energization time, the time setting module 303 corrects the time set in the programmable timer 204. The rewrite module 305 performs rewrite processing for each management block where the corrected time exceeds the time to perform rewrite processing.

It is also possible to correct the patrol period by correcting the time set in the programmable timer 204 based on the calculated non-energization time.

For example, assume that the power shutdown date/time is 0:00 on May 7, 2012, and the energization start date/time is 5:00 on May 7, 2012. In this case, the non-energization time is 5 hrs.

At the time of power-on of the SSD 10, the programmable timer 204 is assumed to start from 0:00 of an undefined day. After that, the host system transmits current time information 2012/5/7 5:00 without delay, and the date/time is corrected.

Assume that the patrol period is 8 hrs, and the preceding patrol execution time is 2012/5/6 23:00. Since the next patrol execution time is 2012/5/7 7:00, correction is executed based on the current time information acquired from the host system, and patrol processing is performed 2 hrs after the current time information setting.

If the time setting module 303 does settings in the programmable timer 204 using a time, the remaining time at the time of power-on is 7 hrs. Since the non-energization time is 5 hrs, the time setting module 303 resets the remaining time to 2 hrs.

When the time set in the programmable timer 204 is corrected based on the calculated non-energization time, rewrite processing can be performed for each management block where the corrected time exceeds the time to perform rewrite processing.

Note that the information to synchronize the time is defined to be given by the host system 40. In many cases, the host system 40 holds the time information using a battery (primary battery or secondary battery) mounted in the host system 40. In a host system such as a server system that operates for a long term, the server system itself is energized for a long term. Hence, it may be impossible to continue the timer operation during the non-energization time of the entire system because of the wear of the battery. For this reason, confirming an anomaly in designated time information is essential in time setting. Regardless of this, to properly execute holding of information stored in the SSD 10, it is important to prepare error processing in case of an unexpected operation of the host system 40.

In general, when the battery has worn and lost its function, the information in the host system 40 often has the default value. The default date/time is normally a past time earlier than the current time in many cases. A logic that the time information can be determined as abnormal if the activation date/time notified at the time of start of energization is earlier than the power shutdown date/time can easily and effectively implemented.

If an anomaly is found, it cannot be determined to what extent the SSD 10 has been placed in the non-energization state. For this reason, if an anomaly is found, the patrol module 304 preferably executes patrol processing.

For example, the time setting module 303 can also determine, based on the power shutdown date/time information stored in the EEPROM 202 and the activation date/time information given by the host system 40, whether an anomaly exists between the power shutdown date/time information and the activation date/time information. Upon determining that an anomaly exists, the time setting module 303 can request the patrol module 304 to execute patrol processing.

(Patrol and Rewrite Processing Request from Host System)

Actual patrol processing can also be regarded as an operation of investigating the storage state of the storage area. Hence, during execution of this operation, the response to an access request from the host system is slow.

In some systems, importance is placed on shortening the time of activation processing from power shutdown. In such a system, parallel execution of patrol processing and rewrite processing is undesirable in a short period of high-load state in which a high speed is necessary at the early stage of power-on.

Figure 13:
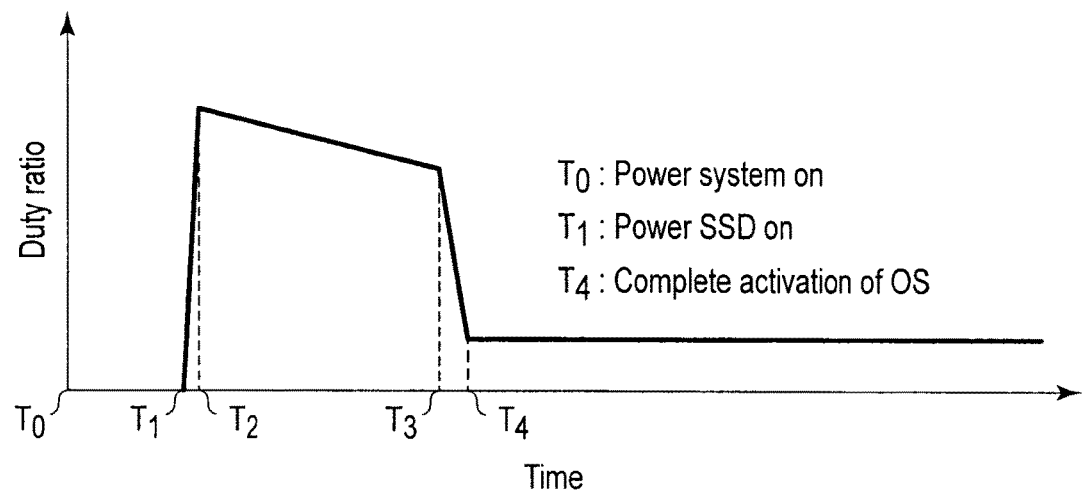
FIG. 13 is an exemplary graph showing the duty ratio of an SSD at the time of activation of the system.

FIG. 13 is a graph showing the duty ratio of the SSD 10 at the time of activation of the system. In FIG. 13, the abscissa represents time, and the ordinate represents the duty ratio. The duty ratio is a value obtained by dividing the time of the operation of the SSD 10 by the total time after activation of the SSD 10. The duty ratio represents the load of the SSD 10.

First, the whole system is powered on (time $T_0$). When simple diagnosis of the system is completed, the SSD 10 is powered on for the activation operation of the operating system (OS) (time $T_1$).

From time $T_2$, the activation operation of the OS starts under high load. However, the operating system is not always activated by the access to the SSD 10. The duty ratio slightly varies because the operating system is activated by expanding programs on internal configuration information or an internal memory (from time $T_3$ to time $T_4$).

From time $T_4$, when the activation operation of the OS is completed, the system transits to the steady state. Hence, the load generally becomes lower than in activation.

In such a system, priority should sometimes be given to the speed of access to the SSD 10 during the period from time $T_1$ to time $T_4$ in FIG. 13 where the operation is done under high load. Since the necessary time is often several minutes, no serious problem arises even if patrol processing and rewrite processing of the SSD 10 are delayed. This is because in general, lowering of the bit error rate of data does not greatly progress during only several minutes. That is, patrol processing and rewrite processing can start from time $T_4$ when the system transits to the steady state. In this case, no problem is posed even if the system outputs an instruction to start patrol processing and rewrite processing in response to the transition to the steady state. Alternatively, information representing whether to start patrol processing and rewrite processing immediately after activation or in accordance with a designation from the host system may be stored in advance in, for example, the EEPROM 202 of the SSD 10.

As a simpler method, upon detecting after power-on that the operation load is equal to or lower than a predetermined level, the high-load operation may be determined to be unnecessary, and patrol processing and rewrite processing may start.

In some systems, importance is placed on shortening the time of activation processing from power shutdown. In such a system, parallel execution of patrol processing and rewrite processing is undesirable in a short period of high-load state in which a high speed is necessary at the early stage of power-on.

The time of activation processing can be shortened by causing the host to instruct the SSD 10 to start patrol processing (or rewrite processing) after the host has transited to the steady state.

Second Embodiment

Figure 14:
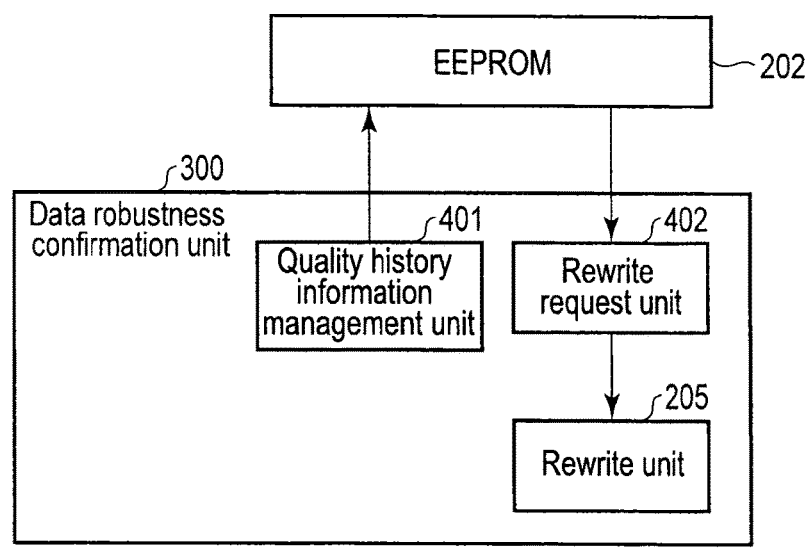
FIG. 14 is an exemplary block diagram showing the arrangement of a data robustness confirmation module according to the second embodiment.

FIG. 14 is an exemplary block diagram showing the arrangement of a data robustness confirmation module according to the second embodiment.

A data robustness confirmation module 300 comprises a quality history information management module 401, and a rewrite request module 402.

The quality history information management module 401 manages the history of the bit error rate of each management block calculated at the time of patrol processing. The history of the bit error rate of each management block is stored in, for example, an EEPROM 202. The EEPROM 202 also stores degradation characteristic data representing a standard bit error rate degradation characteristic shown in FIG. 8.

Based on the write count, the history of the bit error rate of each management block, and the degradation characteristic data, the rewrite request module 402 determines whether the bit error degradation characteristic of each management block is normal. Upon determining that the bit error degradation characteristic of a management block is not normal, the rewrite request module 402 requests a rewrite module 305 to execute rewrite processing of data in the management block.

In the characteristic shown in FIG. 8, although the rewrite count is A, the bit error rate may exhibit the time-rate change for B. The cause is supposed to be a local manufacturing failure of a memory element or the like.

For example, consider a third point $P_3$ from the left when the write count is B.

Originally, the write count is A. Hence, even if the actual bit error degradation characteristic is that for B, the bit error degradation characteristic cannot be obtained only by determining whether the error correction has succeeded or failed. Hence, the write state stands uncorrected until the next patrol processing.

However, when a bit error rate management module manages the history of the bit error rate information of each management block, the tendency of degradation can be obtained from a second point $P_2$ from the left and the third point $P_3$ from the left (first point $P_1$ from the left may also be included). At this time, it can be determined that the bit error rate exhibits the characteristic when the rewrite count is B, although the rewrite count is A. For this reason, the rewrite request module determines that the bit error rate degradation characteristic is not normal.

At a fourth point $P_4$ from the left, the bit error rate reaches the target bit error rate. In such a case, rewrite processing is preferably performed at this point of time.

Note that this method includes an option of not managing the rewrite count on the management block basis.

Although the data retention characteristic changes depending on the ambient temperature, the data recording quality varies depending on written data or the write condition. Since the reproduction quality depends on the recording quality, there exist factors that do not always depend on the rewrite count. In this case, management is done based on not the rewrite count but the reproduction quality. This allows the data recording quality, including the wear caused by an increase in the rewrite count, to be managed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor storage apparatus comprising:
   a non-volatile semiconductor memory in which data is erased in units of one block;
   a temperature sensor mounted on a board in the non-volatile semiconductor storage apparatus; and
   a controller configured to continuously repeat confirming of data in a block at fixed intervals of a first period,
   wherein the controller is further configured to continuously repeat confirming of data in the block at fixed intervals of a second period different from the first period,
   wherein the first period and the second period are based on the temperature measured by the temperature sensor and a number of rewrites, an execution period factor and a reference period.

2. The apparatus of claim 1, wherein the controller is configured to:
   determine the execution period factor based on the number of rewrites and the temperature; and
   determine the second period as a function of multiplying the determined execution period factor by the reference period.

3. The apparatus of claim 1, wherein the controller is configured to determine that the data in the block is not normal based on a bit error rate.

4. The apparatus of claim 1, wherein the controller is configured to request a rewrite of data in the block if the data in the block is not normal based on confirming normalcy of the data stored in the block for the second period.

5. The apparatus of claim 1, wherein the controller is configured to:
   read out the data in the block;
   acquire a number of errors in the data read from the block;
   calculate a bit error rate based on the number of errors; and
   determine that the data in the block is not normal based on the bit error rate.

6. The apparatus of claim 1, wherein the second period is determined based on a change of the temperature information measured during the first period.

7. A non-volatile semiconductor storage apparatus comprising:
   a non-volatile semiconductor memory in which data is erased in units of one block;
   a temperature sensor mounted on a board in the non-volatile semiconductor storage apparatus; and
   a controller configured to continuously repeat an operation of obtaining error information of data in a block at fixed intervals of a first period and confirm data in a block using the error information,
   wherein the controller is further configured to continuously repeat an operation of obtaining the error information of data in the block at fixed intervals of a second period different from the first period,
   wherein the first period and the second period are based on the temperature measured by the temperature sensor and a number of rewrites, an execution period factor and a reference period.

8. The apparatus of claim 7, wherein the second period is determined based on a change of the temperature information measured during the first period.

* * * * *